US012608515B2

(12) United States Patent
Polaji et al.

(10) Patent No.: US 12,608,515 B2
(45) Date of Patent: Apr. 21, 2026

(54) METHOD AND SYSTEM FOR LOG BASED PREDICTIVE ANALYTICS

(71) Applicant: JPMorgan Chase Bank, N.A., New York, NY (US)

(72) Inventors: Prakash Polaji, Hyderabad (IN); Sridhar Reddy Patlolla, Hyderabad (IN); Pradeep Sai Ramisetty, Hyderabad (IN)

(73) Assignee: JPMORGAN CHASE BANK, N.A., New York, NY (US)

( * ) Notice: Subject to any disclaimer, the term of this patent is extended or adjusted under 35 U.S.C. 154(b) by 1062 days.

(21) Appl. No.: 17/648,567

(22) Filed: Jan. 21, 2022

(65) Prior Publication Data

US 2022/0253574 A1    Aug. 11, 2022

Related U.S. Application Data

(60) Provisional application No. 63/157,161, filed on Mar. 5, 2021.

(30) Foreign Application Priority Data

Jan. 22, 2021    (IN) .............................. 202111003058

(51) Int. Cl.
*G06F 30/20*    (2020.01)

(52) U.S. Cl.
CPC .................................... *G06F 30/20* (2020.01)

(58) Field of Classification Search
CPC .......... G06F 30/20; G06F 30/27; G06N 20/00
See application file for complete search history.

(56) References Cited

U.S. PATENT DOCUMENTS

2009/0193298 A1* 7/2009 Mukherjee .......... G06F 11/0766
714/38.1
2019/0034767 A1* 1/2019 Sainani ............... G06F 16/2465

* cited by examiner

*Primary Examiner* — Chuen-Meei Gan
(74) *Attorney, Agent, or Firm* — GREENBLUM & BERNSTEIN, P.L.C.

(57) ABSTRACT

A method for providing predictive analytics based on structured log data is disclosed. The method includes retrieving, via a network interface, raw log data from a data storage component, the raw log data including application information; parsing the raw log data to discover a key token, the key token corresponding to an application; identifying a predetermined label that corresponds to the key token; generating structured log data based on the key token and the predetermined label; retrieving incident data corresponding to the application; and predicting, by using a model, a potential incident based on the structured log data and the incident data.

19 Claims, 11 Drawing Sheets

600

300

202

206(1)

Log Data Labels, Incident Records, and Change Records Repository

204(1)

Log Data Management and Predictive Analytics Module 302

210

Structured Log Data and Machine Learning Models Database

206(2)

210

208(2)

208(1)

400

500

| Application id | Message phrase | Label | Message phrase count | Minute level time stamp | Host name |
|---|---|---|---|---|---|
| 1234 | 404 error while retrieving login page | 404 error | 23 | 10/01/2020 11:01:01 | Rtg4502a |
| ⋮ | | | | | |

METHOD AND SYSTEM FOR LOG BASED PREDICTIVE ANALYTICS

CROSS-REFERENCE TO RELATED APPLICATIONS

This application claims the benefit of Indian Provisional Patent Application No. 202111003058, filed Jan. 22, 2021, which is hereby incorporated by reference in its entirety. This application also claims the benefit of U.S. Provisional Patent Application Ser. No. 63/157,161, filed Mar. 5, 2021, which is hereby incorporated by reference in its entirety.

BACKGROUND

1. Field of the Disclosure

This technology generally relates to methods and systems for predictive analytics, and more particularly to methods and systems for managing structured log data to facilitate predictive analytics of application activities to anticipate errors and identify abnormal application behaviors in a networked environment.

2. Background Information

Many business entities operate expansive networks of applications which generate large volumes of log data. The log data generally include information relating to application behaviors and application interactions. Historically, implementation of conventional log data analytic systems has resulted in varying degrees of success with respect to usability of the log data and efficiency of maintaining the log data.

One drawback of using conventional log data analytic systems is that in many instances, the log data are only examined after an incident has already occurred. As a result, the log data are only used retroactively to understand and resolve the incident. Additionally, due to the indiscriminate process for collecting and storing the log data, the log data often require large data storage resources. As such, old log data are often periodically purged to free up space for new log data. The periodic purging of the old log data impacts an ability to audit applications past a point in time.

Therefore, there is a need to efficiently capture and label useful log data for long term storage to facilitate predictive analytics of application behaviors in a networked environment to anticipate errors and resolve potential issues in advance of an incident.

SUMMARY

The present disclosure, through one or more of its various aspects, embodiments, and/or specific features or sub-components, provides, inter alia, various systems, servers, devices, methods, media, programs, and platforms for managing structured log data to facilitate predictive analytics of application activities to anticipate errors and identify abnormal application behaviors in a networked environment.

According to an aspect of the present disclosure, a method for providing predictive analytics based on structured log data is disclosed. The method may be implemented by at least one processor. The method may include retrieving, via a network interface, raw log data from at least one data storage component, the raw log data may include information corresponding to a plurality of applications; parsing the raw log data to discover at least one key token, the at least one key token may correspond to at least one application; identifying at least one predetermined label that corresponds to the at least one key token; generating structured log data based on the at least one key token and the at least one predetermined label; retrieving incident data corresponding to the plurality of applications; and predicting, by using at least one model, at least one potential incident based on the structured log data and the incident data.

In accordance with an exemplary embodiment, the method may further include determining, for the at least one key token, a number of occurrences in the raw log data, the number of occurrences may relate to a tally of times the at least one key token appears in the raw log data; identifying, in the raw log data, a timestamp for each of the number of occurrences; identifying, in the raw log data, at least one host name for each of the number of occurrences; and updating the structured log data to include at least one from among the number of occurrences, the timestamp, and the at least one host name.

In accordance with an exemplary embodiment, the at least one key token may correspond to at least one textual phrase that includes at least one from among application error information and abnormal application behavior information.

In accordance with an exemplary embodiment, the at least one key token may be discovered in the raw log data by using the at least one model.

In accordance with an exemplary embodiment, the structured log data may include a record data format that corresponds to at least one from among a spreadsheet data format and a tabular data format, the structured log data may relate to condensed application information for at least one event that is smaller in size than the corresponding raw log data.

In accordance with an exemplary embodiment, the method may further include associating a time parameter with the structured log data based on the at least one predetermined label, the time parameter may include an amount of time to persist the structured log data; and persisting the structured log data and the association in the at least one data storage component.

In accordance with an exemplary embodiment, the incident data may include an impact analysis of an event for each of the plurality of applications, the impact analysis may relate to a system impact determination that includes incident records and change records.

In accordance with an exemplary embodiment, the at least one potential incident may relate to a future operational anomaly, the future operational anomaly may include at least one from among an application error condition, an application outage condition, an abnormal application behavior condition, a dependent system error condition, a dependent system outage condition, and an abnormal dependent system behavior condition.

In accordance with an exemplary embodiment, the at least one model may include at least one from among a machine learning model, a mathematical model, a process model, and a data model.

According to an aspect of the present disclosure, a computing device configured to implement an execution of a method for providing predictive analytics based on structured log data is disclosed. The computing device including a processor; a memory; and a communication interface coupled to each of the processor and the memory, wherein the processor may be configured to retrieve, via a network interface, raw log data from at least one data storage component, the raw log data may include information corresponding to a plurality of applications; parse the raw log data to discover at least one key token, the at least one key token may correspond to at least one application; identify at least one predetermined label that corresponds to the at least one key token; generate the structured log data based on the at least one key token and the at least one predetermined label; retrieve incident data corresponding to the plurality of applications; and predict, by using at least one model, at least one potential incident based on the structured log data and the incident data.

In accordance with an exemplary embodiment, the processor may be further configured to determine, for the at least one key token, a number of occurrences in the raw log data, the number of occurrences may relate to a tally of times the at least one key token appears in the raw log data; identify, in the raw log data, a timestamp for each of the number of occurrences; identify, in the raw log data, at least one host name for each of the number of occurrences; and update the structured log data to include at least one from among the number of occurrences, the timestamp, and the at least one host name.

In accordance with an exemplary embodiment, the at least one key token may correspond to at least one textual phrase that includes at least one from among application error information and abnormal application behavior information.

In accordance with an exemplary embodiment, the processor may be further configured to discover the at least one key token in the raw log data by using the at least one model.

In accordance with an exemplary embodiment, the structured log data may include a record data format that corresponds to at least one from among a spreadsheet data format and a tabular data format, the structured log data may relate to condensed application information for at least one event that is smaller in size than the corresponding raw log data.

In accordance with an exemplary embodiment, the processor may be further configured to associate a time parameter with the structured log data based on the at least one predetermined label, the time parameter may include an amount of time to persist the structured log data; and persist the structured log data and the association in the at least one data storage component.

In accordance with an exemplary embodiment, the incident data may include an impact analysis of an event for each of the plurality of applications, the impact analysis may relate to a system impact determination that includes incident records and change records.

In accordance with an exemplary embodiment, the at least one potential incident may relate to a future operational anomaly, the future operational anomaly may include at least one from among an application error condition, an application outage condition, an abnormal application behavior condition, a dependent system error condition, a dependent system outage condition, and an abnormal dependent system behavior condition.

In accordance with an exemplary embodiment, the at least one model may include at least one from among a machine learning model, a mathematical model, a process model, and a data model.

According to an aspect of the present disclosure, a non-transitory computer readable storage medium storing instructions for providing predictive analytics based on structured log data is disclosed. The storage medium including executable code which, when executed by a processor, may cause the processor to retrieve, via a network interface, raw log data from at least one data storage component, the raw log data may include information corresponding to a plurality of applications; parse the raw log data to discover at least one key token, the at least one key token may correspond to at least one application; identify at least one predetermined label that corresponds to the at least one key token; generate the structured log data based on the at least one key token and the at least one predetermined label; retrieve incident data corresponding to the plurality of applications; and predict, by using at least one model, at least one potential incident based on the structured log data and the incident data.

In accordance with an exemplary embodiment, the at least one potential incident may relate to a future operational anomaly, the future operational anomaly may include at least one from among an application error condition, an application outage condition, an abnormal application behavior condition, a dependent system error condition, a dependent system outage condition, and an abnormal dependent system behavior condition.

BRIEF DESCRIPTION OF THE DRAWINGS

The present disclosure is further described in the detailed description which follows, in reference to the noted plurality of drawings, by way of non-limiting examples of preferred embodiments of the present disclosure, in which like characters represent like elements throughout the several views of the drawings.

FIG. 5 is a table that illustrates a structured log data format that is usable for implementing a method for managing structured log data to facilitate predictive analytics of application activities to anticipate errors and identify abnormal application behaviors in a networked environment, according to an exemplary embodiment.

FIG. 11 is a screenshot that illustrates a browser graphical user interface for log data visualization that is usable for implementing a method for managing structured log data to facilitate predictive analytics of application activities to anticipate errors and identify abnormal application behaviors in a networked environment, according to an exemplary embodiment.

DETAILED DESCRIPTION

Through one or more of its various aspects, embodiments and/or specific features or sub-components of the present disclosure, are intended to bring out one or more of the advantages as specifically described above and noted below.

The examples may also be embodied as one or more non-transitory computer readable media having instructions stored thereon for one or more aspects of the present technology as described and illustrated by way of the examples herein. The instructions in some examples include executable code that, when executed by one or more processors, cause the processors to carry out steps necessary to implement the methods of the examples of this technology that are described and illustrated herein.

Figure 1:
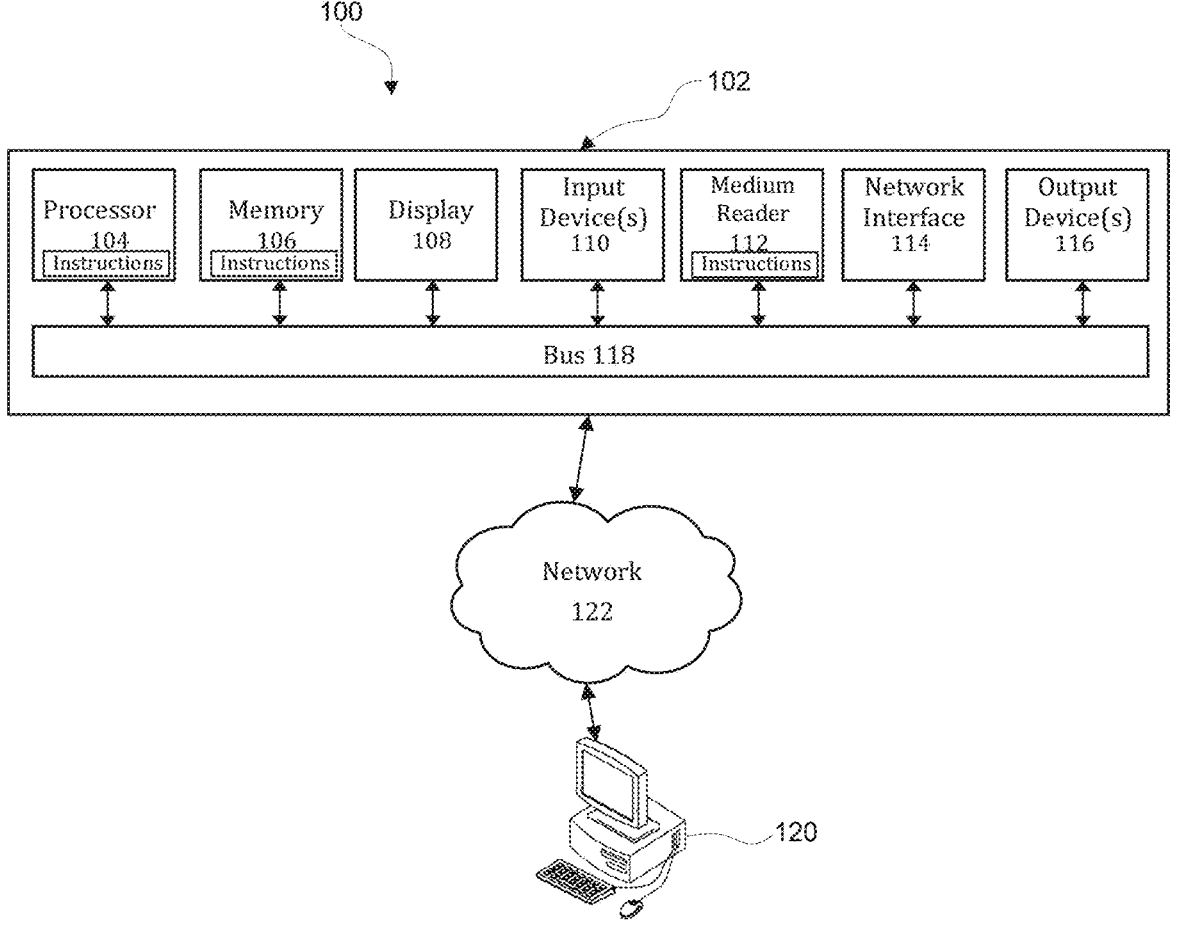
FIG. 1 illustrates an exemplary computer system.

FIG. 1 is an exemplary system for use in accordance with the embodiments described herein. The system 100 is generally shown and may include a computer system 102, which is generally indicated.

The computer system 102 may include a set of instructions that can be executed to cause the computer system 102 to perform any one or more of the methods or computer-based functions disclosed herein, either alone or in combination with the other described devices. The computer system 102 may operate as a standalone device or may be connected to other systems or peripheral devices. For example, the computer system 102 may include, or be included within, any one or more computers, servers, systems, communication networks or cloud environment. Even further, the instructions may be operative in such cloud-based computing environment.

In a networked deployment, the computer system 102 may operate in the capacity of a server or as a client user computer in a server-client user network environment, a client user computer in a cloud computing environment, or as a peer computer system in a peer-to-peer (or distributed) network environment. The computer system 102, or portions thereof, may be implemented as, or incorporated into, various devices, such as a personal computer, a tablet computer, a set-top box, a personal digital assistant, a mobile device, a palmtop computer, a laptop computer, a desktop computer, a communications device, a wireless smart phone, a personal trusted device, a wearable device, a global positioning satellite (GPS) device, a web appliance, or any other machine capable of executing a set of instructions (sequential or otherwise) that specify actions to be taken by that machine. Further, while a single computer system 102 is illustrated, additional embodiments may include any collection of systems or sub-systems that individually or jointly execute instructions or perform functions. The term "system" shall be taken throughout the present disclosure to include any collection of systems or sub-systems that individually or jointly execute a set, or multiple sets, of instructions to perform one or more computer functions.

As illustrated in FIG. 1, the computer system 102 may include at least one processor 104. The processor 104 is tangible and non-transitory. As used herein, the term "non-transitory" is to be interpreted not as an eternal characteristic of a state, but as a characteristic of a state that will last for a period of time. The term "non-transitory" specifically disavows fleeting characteristics such as characteristics of a particular carrier wave or signal or other forms that exist only transitorily in any place at any time. The processor 104 is an article of manufacture and/or a machine component. The processor 104 is configured to execute software instructions in order to perform functions as described in the various embodiments herein. The processor 104 may be a general-purpose processor or may be part of an application specific integrated circuit (ASIC). The processor 104 may also be a microprocessor, a microcomputer, a processor chip, a controller, a microcontroller, a digital signal processor (DSP), a state machine, or a programmable logic device. The processor 104 may also be a logical circuit, including a programmable gate array (PGA) such as a field programmable gate array (FPGA), or another type of circuit that includes discrete gate and/or transistor logic. The processor 104 may be a central processing unit (CPU), a graphics processing unit (GPU), or both. Additionally, any processor described herein may include multiple processors, parallel processors, or both. Multiple processors may be included in, or coupled to, a single device or multiple devices.

The computer system 102 may also include a computer memory 106. The computer memory 106 may include a static memory, a dynamic memory, or both in communication. Memories described herein are tangible storage mediums that can store data and executable instructions, and are non-transitory during the time instructions are stored therein. Again, as used herein, the term "non-transitory" is to be interpreted not as an eternal characteristic of a state, but as a characteristic of a state that will last for a period of time. The term "non-transitory" specifically disavows fleeting characteristics such as characteristics of a particular carrier wave or signal or other forms that exist only transitorily in any place at any time. The memories are an article of manufacture and/or machine component. Memories described herein are computer-readable mediums from which data and executable instructions can be read by a computer. Memories as described herein may be random access memory (RAM), read only memory (ROM), flash memory, electrically programmable read only memory (EPROM), electrically erasable programmable read-only memory (EEPROM), registers, a hard disk, a cache, a removable disk, tape, compact disk read only memory (CD-ROM), digital versatile disk (DVD), floppy disk, blu-ray disk, or any other form of storage medium known in the art. Memories may be volatile or non-volatile, secure and/or encrypted, unsecure and/or unencrypted. Of course, the computer memory 106 may comprise any combination of memories or a single storage.

The computer system 102 may further include a display 108, such as a liquid crystal display (LCD), an organic light emitting diode (OLED), a flat panel display, a solid-state display, a cathode ray tube (CRT), a plasma display, or any other type of display, examples of which are well known to skilled persons.

The computer system 102 may also include at least one input device 110, such as a keyboard, a touch-sensitive input screen or pad, a speech input, a mouse, a remote-control device having a wireless keypad, a microphone coupled to a speech recognition engine, a camera such as a video camera or still camera, a cursor control device, a global positioning system (GPS) device, an altimeter, a gyroscope, an accelerometer, a proximity sensor, or any combination thereof. Those skilled in the art appreciate that various embodiments of the computer system 102 may include multiple input devices 110. Moreover, those skilled in the art further appreciate that the above-listed, exemplary input devices 110 are not meant to be exhaustive and that the computer system 102 may include any additional, or alternative, input devices 110.

The computer system 102 may also include a medium reader 112 which is configured to read any one or more sets of instructions, e.g., software, from any of the memories described herein. The instructions, when executed by a processor, can be used to perform one or more of the methods and processes as described herein. In a particular embodiment, the instructions may reside completely, or at least partially, within the memory 106, the medium reader 112, and/or the processor 110 during execution by the computer system 102.

Furthermore, the computer system 102 may include any additional devices, components, parts, peripherals, hardware, software, or any combination thereof which are commonly known and understood as being included with or within a computer system, such as, but not limited to, a network interface 114 and an output device 116. The output device 116 may be, but is not limited to, a speaker, an audio out, a video out, a remote-control output, a printer, or any combination thereof.

Each of the components of the computer system 102 may be interconnected and communicate via a bus 118 or other communication link. As shown in FIG. 1, the components may each be interconnected and communicate via an internal bus. However, those skilled in the art appreciate that any of the components may also be connected via an expansion bus. Moreover, the bus 118 may enable communication via any standard or other specification commonly known and understood such as, but not limited to, peripheral component interconnect, peripheral component interconnect express, parallel advanced technology attachment, serial advanced technology attachment, etc.

The computer system 102 may be in communication with one or more additional computer devices 120 via a network 122. The network 122 may be, but is not limited to, a local area network, a wide area network, the Internet, a telephony network, a short-range network, or any other network commonly known and understood in the art. The short-range network may include, for example, Bluetooth, Zigbee, infrared, near field communication, ultraband, or any combination thereof. Those skilled in the art appreciate that additional networks 122 which are known and understood may additionally or alternatively be used and that the exemplary networks 122 are not limiting or exhaustive. Also, while the network 122 is shown in FIG. 1 as a wireless network, those skilled in the art appreciate that the network 122 may also be a wired network.

The additional computer device 120 is shown in FIG. 1 as a personal computer. However, those skilled in the art appreciate that, in alternative embodiments of the present application, the computer device 120 may be a laptop computer, a tablet PC, a personal digital assistant, a mobile device, a palmtop computer, a desktop computer, a communications device, a wireless telephone, a personal trusted device, a web appliance, a server, or any other device that is capable of executing a set of instructions, sequential or otherwise, that specify actions to be taken by that device. Of course, those skilled in the art appreciate that the above-listed devices are merely exemplary devices and that the device 120 may be any additional device or apparatus commonly known and understood in the art without departing from the scope of the present application. For example, the computer device 120 may be the same or similar to the computer system 102. Furthermore, those skilled in the art similarly understand that the device may be any combination of devices and apparatuses.

Of course, those skilled in the art appreciate that the above-listed components of the computer system 102 are merely meant to be exemplary and are not intended to be exhaustive and/or inclusive. Furthermore, the examples of the components listed above are also meant to be exemplary and similarly are not meant to be exhaustive and/or inclusive.

In accordance with various embodiments of the present disclosure, the methods described herein may be implemented using a hardware computer system that executes software programs. Further, in an exemplary, non-limited embodiment, implementations can include distributed processing, component/object distributed processing, and parallel processing. Virtual computer system processing can be constructed to implement one or more of the methods or functionalities as described herein, and a processor described herein may be used to support a virtual processing environment.

As described herein, various embodiments provide optimized methods and systems for managing structured log data to facilitate predictive analytics of application activities to anticipate errors and identify abnormal application behaviors in a networked environment.

Figure 2:
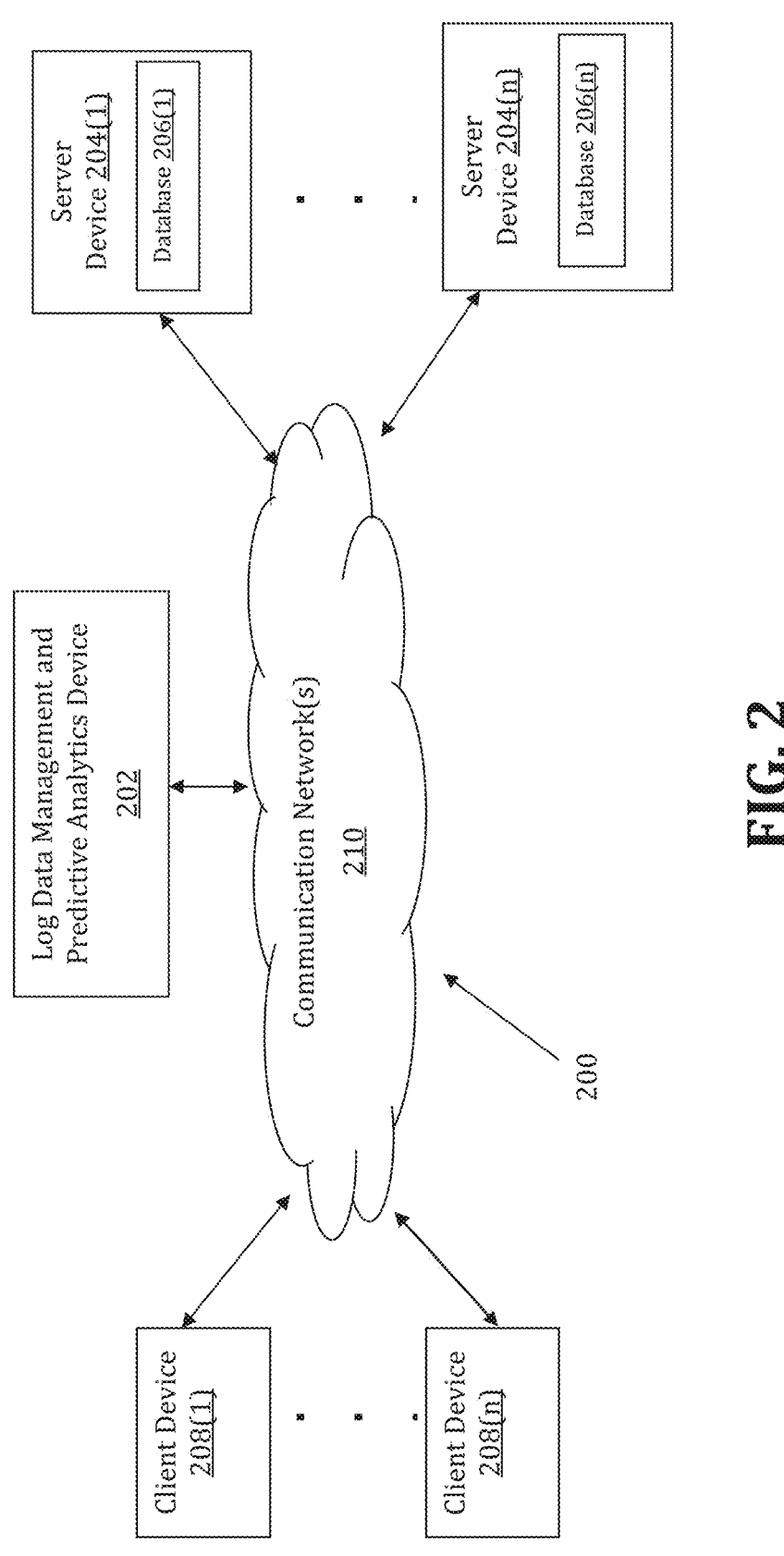
FIG. 2 illustrates an exemplary diagram of a network environment.

Referring to FIG. 2, a schematic of an exemplary network environment 200 for implementing a method for managing structured log data to facilitate predictive analytics of application activities to anticipate errors and identify abnormal application behaviors in a networked environment is illustrated. In an exemplary embodiment, the method is executable on any networked computer platform, such as, for example, a personal computer (PC).

The method for managing structured log data to facilitate predictive analytics of application activities to anticipate errors and identify abnormal application behaviors in a networked environment may be implemented by a Log Data Management and Predictive Analytics (LDMPA) device 202. The LDMPA device 202 may be the same or similar to the computer system 102 as described with respect to FIG. 1. The LDMPA device 202 may store one or more applications that can include executable instructions that, when executed by the LDMPA device 202, cause the LDMPA device 202 to perform actions, such as to transmit, receive, or otherwise process network messages, for example, and to perform other actions described and illustrated below with reference to the figures. The application(s) may be implemented as modules or components of other applications. Further, the application(s) can be implemented as operating system extensions, modules, plugins, or the like.

Even further, the application(s) may be operative in a cloud-based computing environment. The application(s) may be executed within or as virtual machine(s) or virtual server(s) that may be managed in a cloud-based computing environment. Also, the application(s), and even the LDMPA device 202 itself, may be located in virtual server(s) running in a cloud-based computing environment rather than being tied to one or more specific physical network computing devices. Also, the application(s) may be running in one or more virtual machines (VMs) executing on the LDMPA device 202. Additionally, in one or more embodiments of this technology, virtual machine(s) running on the LDMPA device 202 may be managed or supervised by a hypervisor.

In the network environment 200 of FIG. 2, the LDMPA device 202 is coupled to a plurality of server devices 204(1)-204(n) that hosts a plurality of databases 206(1)-206 (n), and also to a plurality of client devices 208(1)-208(n) via communication network(s) 210. A communication interface of the LDMPA device 202, such as the network interface 114 of the computer system 102 of FIG. 1, operatively couples and communicates between the LDMPA device 202, the server devices 204(1)-204(n), and/or the client devices 208(1)-208(n), which are all coupled together by the communication network(s) 210, although other types and/or numbers of communication networks or systems with other types and/or numbers of connections and/or configurations to other devices and/or elements may also be used.

The communication network(s) 210 may be the same or similar to the network 122 as described with respect to FIG. 1, although the LDMPA device 202, the server devices 204(1)-204(n), and/or the client devices 208(1)-208(n) may be coupled together via other topologies. Additionally, the network environment 200 may include other network devices such as one or more routers and/or switches, for example, which are well known in the art and thus will not be described herein. This technology provides a number of advantages including methods, non-transitory computer readable media, and LDMPA devices that efficiently implement a method for managing structured log data to facilitate predictive analytics of application activities to anticipate errors and identify abnormal application behaviors in a networked environment.

By way of example only, the communication network(s) 210 may include local area network(s) (LAN(s)) or wide area network(s) (WAN(s)), and can use TCP/IP over Ethernet and industry-standard protocols, although other types and/or numbers of protocols and/or communication networks may be used. The communication network(s) 210 in this example may employ any suitable interface mechanisms and network communication technologies including, for example, teletraffic in any suitable form (e.g., voice, modem, and the like), Public Switched Telephone Network (PSTNs), Ethernet-based Packet Data Networks (PDNs), combinations thereof, and the like.

The LDMPA device 202 may be a standalone device or integrated with one or more other devices or apparatuses, such as one or more of the server devices 204(1)-204(n), for example. In one particular example, the LDMPA device 202 may include or be hosted by one of the server devices 204(1)-204(n), and other arrangements are also possible. Moreover, one or more of the devices of the LDMPA device 202 may be in a same or a different communication network including one or more public, private, or cloud networks, for example.

The plurality of server devices 204(1)-204(n) may be the same or similar to the computer system 102 or the computer device 120 as described with respect to FIG. 1, including any features or combination of features described with respect thereto. For example, any of the server devices 204(1)-204 (n) may include, among other features, one or more processors, a memory, and a communication interface, which are coupled together by a bus or other communication link, although other numbers and/or types of network devices may be used. The server devices 204(1)-204(n) in this example may process requests received from the LDMPA device 202 via the communication network(s) 210 according to the HTTP-based and/or JavaScript Object Notation (JSON) protocol, for example, although other protocols may also be used.

The server devices 204(1)-204(n) may be hardware or software or may represent a system with multiple servers in a pool, which may include internal or external networks. The server devices 204(1)-204(n) hosts the databases 206(1)-206 (n) that are configured to store data that relates to raw log data, structured log data, log labels, incident records, change records, and machine learning models.

Although the server devices 204(1)-204(n) are illustrated as single devices, one or more actions of each of the server devices 204(1)-204(n) may be distributed across one or more distinct network computing devices that together comprise one or more of the server devices 204(1)-204(n). Moreover, the server devices 204(1)-204(n) are not limited to a particular configuration. Thus, the server devices 204 (1)-204(n) may contain a plurality of network computing devices that operate using a master/slave approach, whereby one of the network computing devices of the server devices 204(1)-204(n) operates to manage and/or otherwise coordinate operations of the other network computing devices.

The server devices 204(1)-204(n) may operate as a plurality of network computing devices within a cluster architecture, a peer-to peer architecture, virtual machines, or within a cloud architecture, for example. Thus, the technology disclosed herein is not to be construed as being limited to a single environment and other configurations and architectures are also envisaged.

The plurality of client devices 208(1)-208(n) may also be the same or similar to the computer system 102 or the computer device 120 as described with respect to FIG. 1, including any features or combination of features described with respect thereto. For example, the client devices 208 (1)-208(n) in this example may include any type of computing device that can interact with the LDMPA device 202 via communication network(s) 210. Accordingly, the client devices 208(1)-208(n) may be mobile computing devices, desktop computing devices, laptop computing devices, tablet computing devices, virtual machines (including cloud-based computers), or the like, that host chat, e-mail, or voice-to-text applications, for example. In an exemplary embodiment, at least one client device 208 is a wireless mobile communication device, i.e., a smart phone.

The client devices 208(1)-208(n) may run interface applications, such as standard web browsers or standalone client applications, which may provide an interface to communicate with the LDMPA device 202 via the communication network(s) 210 in order to communicate user requests and information. The client devices 208(1)-208(n) may further include, among other features, a display device, such as a display screen or touchscreen, and/or an input device, such as a keyboard, for example.

Although the exemplary network environment 200 with the LDMPA device 202, the server devices 204(1)-204(n), the client devices 208(1)-208(n), and the communication network(s) 210 are described and illustrated herein, other types and/or numbers of systems, devices, components, and/or elements in other topologies may be used. It is to be understood that the systems of the examples described herein are for exemplary purposes, as many variations of the specific hardware and software used to implement the examples are possible, as will be appreciated by those skilled in the relevant art(s).

One or more of the devices depicted in the network environment 200, such as the LDMPA device 202, the server devices 204(1)-204(n), or the client devices 208(1)-208(n), for example, may be configured to operate as virtual instances on the same physical machine. In other words, one or more of the LDMPA device 202, the server devices 204(1)-204(n), or the client devices 208(1)-208(n) may operate on the same physical device rather than as separate devices communicating through communication network(s) 210. Additionally, there may be more or fewer LDMPA devices 202, server devices 204(1)-204(n), or client devices 208(1)-208(n) than illustrated in FIG. 2.

In addition, two or more computing systems or devices may be substituted for any one of the systems or devices in any example. Accordingly, principles and advantages of distributed processing, such as redundancy and replication, also may be implemented, as desired, to increase the robustness and performance of the devices and systems of the examples. The examples may also be implemented on computer system(s) that extend across any suitable network using any suitable interface mechanisms and traffic technologies, including by way of example only teletraffic in any suitable form (e.g., voice and modem), wireless traffic networks, cellular traffic networks, Packet Data Networks (PDNs), the Internet, intranets, and combinations thereof.

Figure 3:
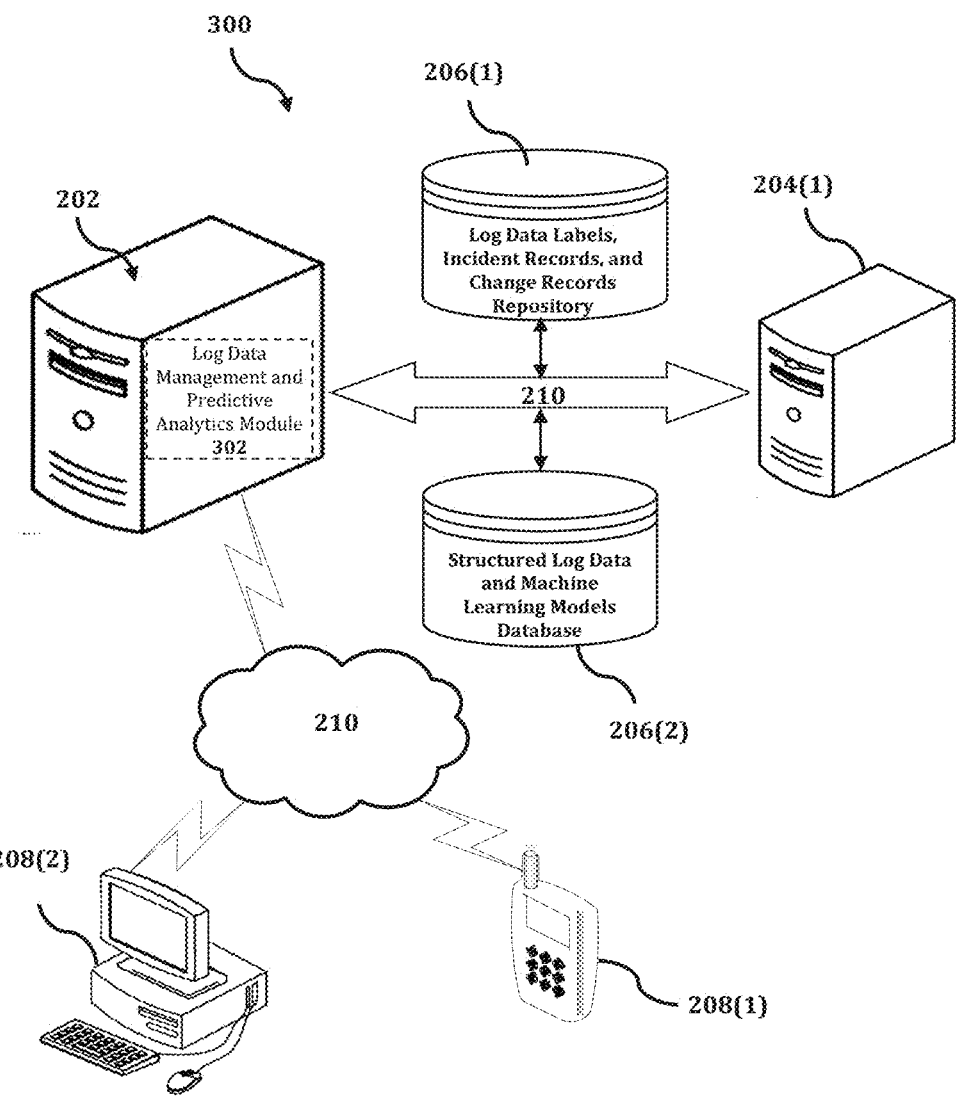
FIG. 3 shows an exemplary system for implementing a method for managing structured log data to facilitate predictive analytics of application activities to anticipate errors and identify abnormal application behaviors in a networked environment.

The LDMPA device 202 is described and shown in FIG. 3 as including a log data management and predictive analytics module 302, although it may include other rules, policies, modules, databases, or applications, for example. As will be described below, the log data management and predictive analytics module 302 is configured to implement a method for managing structured log data to facilitate predictive analytics of application activities to anticipate errors and identify abnormal application behaviors in a networked environment.

An exemplary process 300 for implementing a mechanism for managing structured log data to facilitate predictive analytics of application activities to anticipate errors and identify abnormal application behaviors in a networked environment by utilizing the network environment of FIG. 2 is shown as being executed in FIG. 3. Specifically, a first client device 208(1) and a second client device 208(2) are illustrated as being in communication with LDMPA device 202. In this regard, the first client device 208(1) and the second client device 208(2) may be "clients" of the LDMPA device 202 and are described herein as such. Nevertheless, it is to be known and understood that the first client device 208(1) and/or the second client device 208(2) need not necessarily be "clients" of the LDMPA device 202, or any entity described in association therewith herein. Any additional or alternative relationship may exist between either or both of the first client device 208(1) and the second client device 208(2) and the LDMPA device 202, or no relationship may exist.

Further, LDMPA device 202 is illustrated as being able to access a log data labels, incident records, and change records repository 206(1) and a structured log data and machine learning models database 206(2). The log data management and predictive analytics module 302 may be configured to access these databases for implementing a method for managing structured log data to facilitate predictive analytics of application activities to anticipate errors and identify abnormal application behaviors in a networked environment.

The first client device 208(1) may be, for example, a smart phone. Of course, the first client device 208(1) may be any additional device described herein. The second client device 208(2) may be, for example, a personal computer (PC). Of course, the second client device 208(2) may also be any additional device described herein.

The process may be executed via the communication network(s) 210, which may comprise plural networks as described above. For example, in an exemplary embodiment, either or both of the first client device 208(1) and the second client device 208(2) may communicate with the LDMPA device 202 via broadband or cellular communication. Of course, these embodiments are merely exemplary and are not limiting or exhaustive.

Upon being started, the log data management and predictive analytics module 302 executes a process for managing structured log data to facilitate predictive analytics of application activities to anticipate errors and identify abnormal application behaviors in a networked environment. An exemplary process for managing structured log data to facilitate predictive analytics of application activities to anticipate errors and identify abnormal application behaviors in a networked environment is generally indicated at flowchart 400 in FIG. 4.

Figure 4:
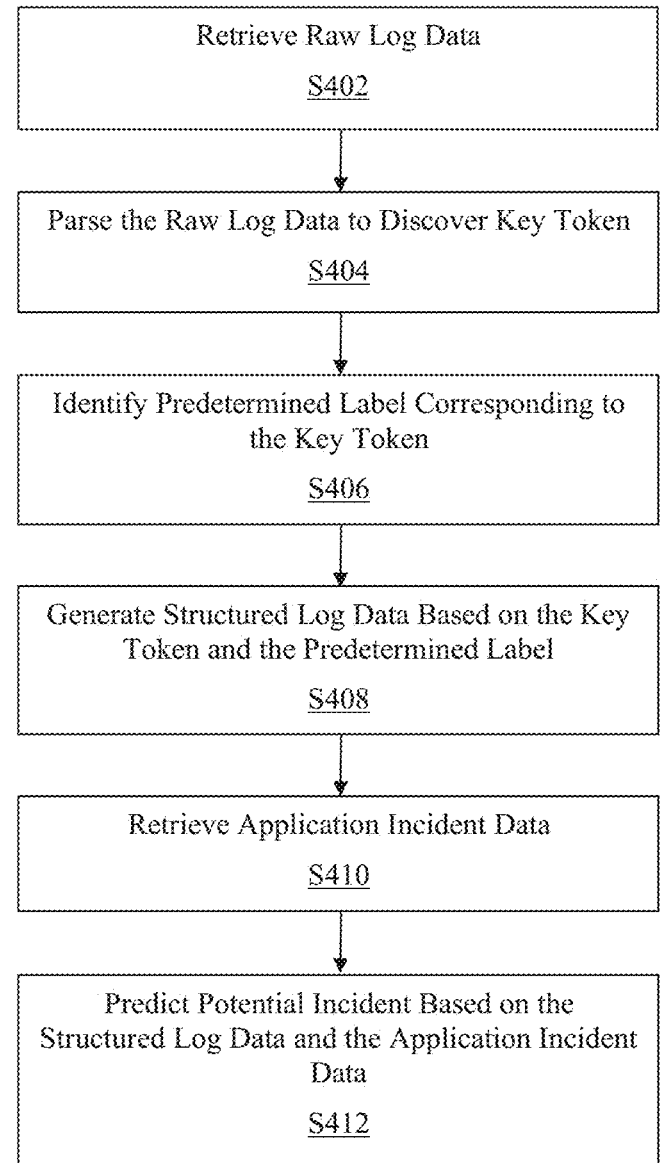
FIG. 4 is a flowchart of an exemplary process for implementing a method for managing structured log data to facilitate predictive analytics of application activities to anticipate errors and identify abnormal application behaviors in a networked environment.

In the process 400 of FIG. 4, at step S402, raw log data from a data storage component may be received via a network interface. The raw log data may include information corresponding to a plurality of applications. In an exemplary embodiment, the raw log data may include a computer-generated data file such as, for example, a log file that contains information about usage patterns, activities, and operations within at least one from among an operating system, an application, a server, and a connected device. The raw log data may be automatically computer-generated whenever an event with a specific classification takes place. In another exemplary embodiment, analytics tools such as, for example, security event monitoring (SEM), security information management (SIM), as well as security information and event management (SIEM) may be utilized to aggregate raw log files from an enterprise computing environment.

In another exemplary embodiment, the raw log data may include information in a format such as, for example, a textual record format. The raw log data may also include a description of a detected event. For example, the raw log data may include a textual record which describes the detected event as a 404-type error that occurred while retrieving a login page. As will be appreciated by a person of ordinary skill in the art, the raw log data may include information in a natural human language such as, for example, an English language as well as in a computer readable language.

At step S404, the raw log data may be parsed to discover a key token. The key token may include application information and may correspond to a specific application. In an exemplary embodiment, the key token may also correspond to a textual phrase that includes at least one from among application error information and abnormal application behavior information. For example, a key token may relate to a "404 error" and may include a textual phrase describing the error such as "404 error while retrieving login page." In another exemplary embodiment, the discovered key token may be extracted from the raw log file and stored in a temporary data storage component. The extracted key token may be associated with the specific application based on an identifier such as, for example, an application identifier.

In another exemplary embodiment, the raw log data may be parsed based on an analytical technique such as, for example, a syntactic analysis technique. The raw log data may be parsed to identify constituent parts and relationships between each of the constituent parts. In another exemplary embodiment, the constituent parts and the relationships between each of the constituent parts may be graphically represented in a data structure such as, for example, a parse tree, a derivation tree, and a concrete syntax tree. As will be appreciated by a person of ordinary skill in the art, the parsed raw log data may also include semantic information as well as probability information relating to the parsing process.

In another exemplary embodiment, a model may be utilized to discover the key token from within the raw log data. The model may include a representation of an algorithm such as, for example, a machine learning model, a mathematical model, a process model, and a data model. The model may be generated, trained, and utilized consistent with disclosures in the present application. In another exemplary embodiment, a machine learning based, text extraction library may be utilized to identify and extract the key tokens.

At step S406, a predetermined label that corresponds to the key token may be identified. The predetermined label may describe the event in the key token. For example, the predetermined label may include a "404 error" descriptor when the key token includes a message phrase such as "404 error while retrieving login page." In an exemplary embodiment, the predetermined label may be identified from the data storage component. The predetermined label may be predetermined by an administrator for each event type and stored in the data storage component. For example, a one-time exercise of arriving at the right labels for an application may be implemented by an administrator based on historical raw log data. In another exemplary embodiment, the predetermined label may be automatically generated by a labeling component based on the message phrase in the key token. A model may be utilized by a labeling component consistent with disclosures in the present application to automatically generate the predetermined label.

At step S408, structured log data may be generated based on the key token and the predetermined label. In an exemplary embodiment, the structured log data may include a record data format that corresponds to at least one from among a spreadsheet data format and a tabular data format. For example, the structured log data may include rows and columns containing information corresponding to the key token and the predetermined label. In another exemplary embodiment, the structured log data may include information such as, for example, application identifier information, message phrase information, label information, message phrase count information, minute level time stamp information, and host name information relating to an application and a corresponding event.

In another exemplary embodiment, the structured log data may be stored in the data storage component. The structured log data may be stored based on a predetermined amount of time. In another exemplary embodiment, the structured log data may be aggregated based on a common characteristic and stored as a batch in the data storage component. For example, structured log data corresponding to a particular application outage may be aggregated and stored together in the data storage component. In another exemplary embodiment, the stored structured log data may be utilized to train the machine learning model consistent with disclosures in the present application. As will be appreciated by a person of ordinary skill in the art, the structured log data file is smaller in size than the corresponding raw log data file due to the inclusion of only pertinent data in the structured log data file. As such, a given storage allocation will be able to store more structured log data files than raw log data files.

At step S410, incident data corresponding to the plurality of applications may be retrieved via the network interface. The incident data may include information corresponding to a particular event that has been captured by other network analytics components. In an exemplary embodiment, the incident data may include an impact analysis that has been completed for the particular event. The impact analysis may relate to a system impact determination corresponding to an event such as, for example, an application outage. For example, the impact analysis may include information relating to how many connected applications in a networked environment were affected by the application outage and their associated downtime. In another exemplary embodiment, the incident data may be retrieved from the data storage component. The incident data may also include records such as, for example, incident records and change records.

At step S412, by using a model, a potential incident may be predicted based on the structured log data and the incident data. The potential incident may relate to a future operational anomaly such as, for example, an application error condition, an application outage condition, an abnormal application behavior condition, a dependent system error condition, a dependent system outage condition, and an abnormal dependent system behavior condition. In an exemplary embodiment, the model may be invoked based on a predetermined time period such as, for example, every 15 minutes to predict a potential incident. The model may be automatically invoked based on the predetermined time period as well as manually invoked by a user on an ad-hoc basis.

In another exemplary embodiment, the model may receive as input information such as, for example, the structured log data as well as the incident data and output the potential incident. The model may utilize machine learning algorithms to detect patterns in the structured log data and the incident data to anticipate a potential incident. As will be appreciated by a person of ordinary skill in the art, the model may predict future incidents based on past incidents and log data correlation.

In another exemplary embodiment, the model may include at least one from among a machine learning model, a mathematical model, a process model, and a data model. The model may also include stochastic models such as, for example, a Markov model that is used to model randomly changing systems. In stochastic models, the future states of a system may be assumed to depend only on the current state of the system.

In another exemplary embodiment, machine learning and pattern recognition may include supervised learning algorithms such as, for example, k-medoids analysis, regression analysis, decision tree analysis, random forest analysis, k-nearest neighbors analysis, logistic regression analysis, etc. In another exemplary embodiment, machine learning analytical techniques may include unsupervised learning algorithms such as, for example, Apriori analysis, K-means clustering analysis, etc. In another exemplary embodiment, machine learning analytical techniques may include reinforcement learning algorithms such as, for example, Markov Decision Process, etc.

In another exemplary embodiment, the model may be based on a machine learning algorithm. The machine learning algorithm may include at least one from among a process and a set of rules to be followed by a computer in calculations and other problem-solving operations such as, for example, a linear regression algorithm, a logistic regression algorithm, a decision tree algorithm, or a Naive Bayes algorithm.

In another exemplary embodiment, the model may include training models such as, for example, a machine learning model which is generated to be further trained on additional data. Once the training model has been sufficiently trained, the training model may be deployed onto various connected systems to be utilized. In another exemplary embodiment, the training model may be sufficiently trained when model assessment methods such as, for example, a holdout method, a K-fold-cross-validation method, and a bootstrap method determine that the training model's least squares error rate, true positive rate, true negative rate, false positive rate, and false negative rates are within predetermined ranges. In another exemplary embodiment, the training model may be operable, i.e., actively utilized by an organization, while continuing to be trained using new data. In another exemplary embodiment, the models may be generated using at least one from among an artificial neural network technique, a decision tree technique, a support vector machines technique, a Bayesian network technique, and a genetic algorithms technique.

In another exemplary embodiment, the potential incident predicted by the model may be visualized in a graphical user interface. The graphical user interface may include information such as, for example, log messages, incident data, change data, and time stamps that relates to the potential incident. In another exemplary embodiment the graphical user interface may include graphical representations of the information. The graphical representations may include visualization graphs that are embedded within the graphical user interface. As will be appreciated by a person of ordinary skill in the art, the graphical user interface may be a part of a standalone visualization application as well as a part of a web browser-based user interface.

In another exemplary embodiment, a number of occurrences in the raw log data may be determined for the key token. The number of occurrences may relate to a tally of times the key token appears in the raw log data. For example, the raw log data may include 23 occurrences of an exemplary key token titled "404 error while retrieving login page." As such, the number of occurrences for the exemplary key token may be determined to be 23. In another exemplary embodiment, the number of occurrences may correspond to a user predetermined time such as, for example, a number of occurrences of the key token per minute.

In another exemplary embodiment, a timestamp may be identified in the raw log data for each of the number of occurrences. The time stamp may correspond to a time when the issue relating to the key token was logged by the system. Similarly, in another exemplary embodiment, a host name may be identified in the raw log data for each of the number of occurrences. The host name may correspond to a host that an application was connected to when the issue relating to the key token was logged by the system.

Then, in another exemplary embodiment, the structured log data may be updated to include at least one from among the number of occurrences, the timestamp, and the host name. As will be appreciated by a person of ordinary skill in the art, the number of occurrences, the timestamp, and the host name may be interchangeable with other information as determined by an administrator. For example, the host name may be interchangeable with other information relating to the host such as a host identifier.

FIG. 5 is a table 500 that illustrates a structured log data format that is usable for implementing a method for managing structured log data to facilitate predictive analytics of application activities to anticipate errors and identify abnormal application behaviors in a networked environment, according to an exemplary embodiment. As illustrated in FIG. 5, the structured log data format utilizes rows and columns to organize data. Each column of the structured log data format may correspond to a type of data that is stored in the column and include a descriptor. The structured log data format may include columns such as, for example, an application identifier column titled "Application ID," a key token column titled "Message Phrase," a predetermined label column titled "Label," a number of occurrences column titled "Message Phrase Count," a timestamp column titled "Minute Level Time Stamp," and a host name column titled "Host Name."

Figure 6:
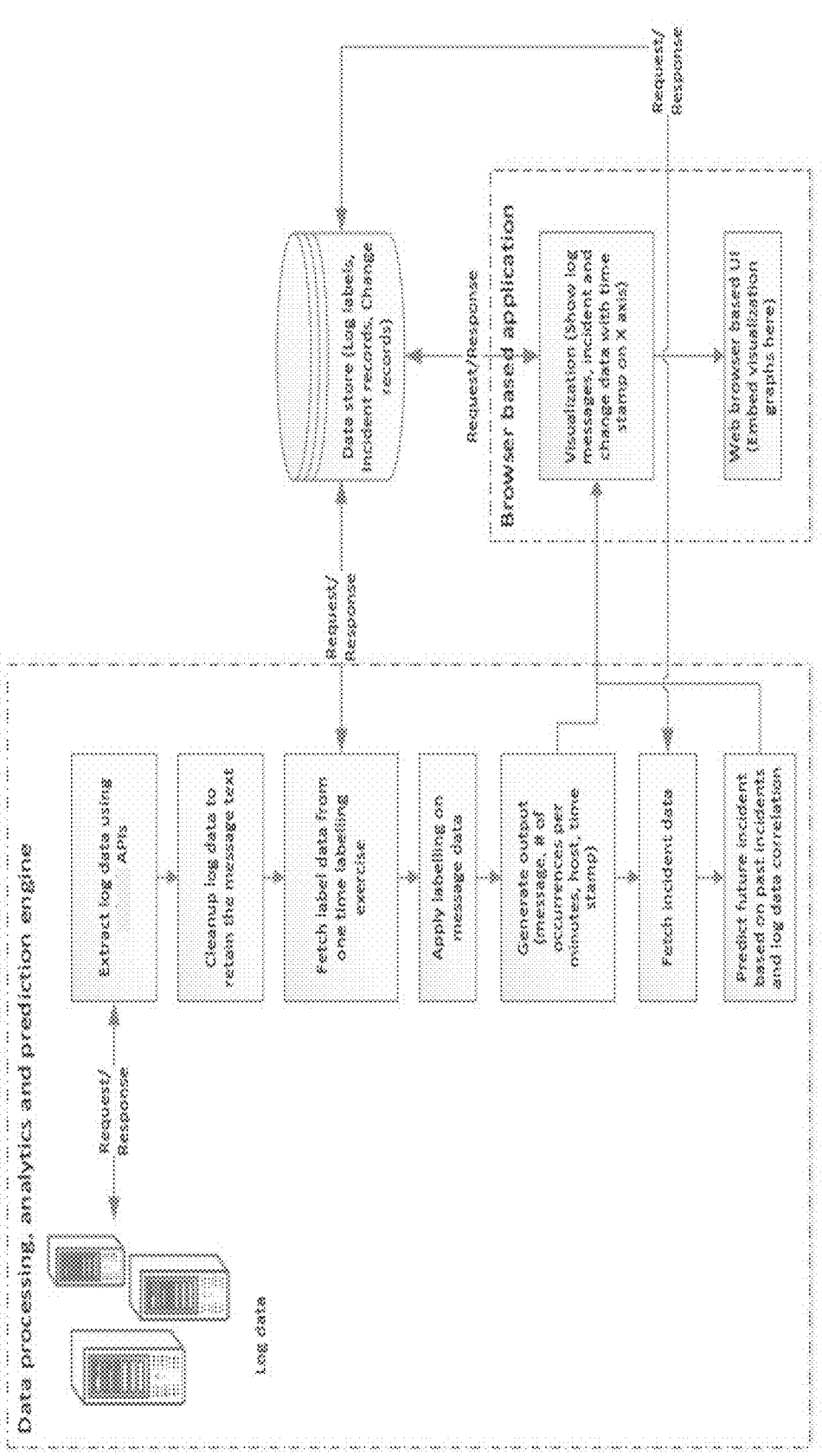
FIG. 6 is a flow diagram of an exemplary process for implementing a method for managing structured log data to facilitate predictive analytics of application activities to anticipate errors and identify abnormal application behaviors in a networked environment.

FIG. 6 is a flow diagram 600 of an exemplary architecture for implementing a method for managing structured log data to facilitate predictive analytics of application activities to anticipate errors and identify abnormal application behaviors in a networked environment.

As illustrated in FIG. 6, the exemplary architecture includes a data processing, analytics, and prediction engine as well as a connected data store and a browser-based data visualization component. The data processing, analytics, and prediction engine utilizes an application programing interface (API) such as, for example, a SPLUNK API to communicate with and extract raw log data from a log data storage component. The raw log data may then be cleaned to retain key tokens such as, for example, textual message phrases. The data processing, analytics, and prediction engine may fetch label data from a connected data store that includes predetermined log labels. The predetermined log labels may be generated based on a one-time labeling exercise and stored in the connected data store together with incident records and change records.

Next, the data processing, analytics, and prediction engine may apply the fetched labeling data to the key token by associating the labeling data with the key token. The data processing, analytics, and prediction engine may utilize the labeling data and the key token to generate structured log data. The outputted structured log data may include the key token, the textual message phrase, a number of occurrences per minute, a host name, and a time stamp. The structured log data may be transmitted to the browser-based data visualization component for visualization. The browser-based data visualization component may be utilized to show the key token, the textual message phrases, incident data, and change data on a graphical element. The graphical element may be embedded in a graphical user interface and may include an X-axis and a Y-axis.

Then, the data processing, analytics, and prediction engine may retrieve incident data from the connected data store. The data processing, analytics, and prediction engine may utilize a machine learning model to predict future incidents based on past incidents and log data correlation. The predicted future incident may be transmitted to the browser-based data visualization component. The browser-based data visualization component may render the predicted future incident as graphical elements to be displayable on the graphical user interface.

Figure 7:
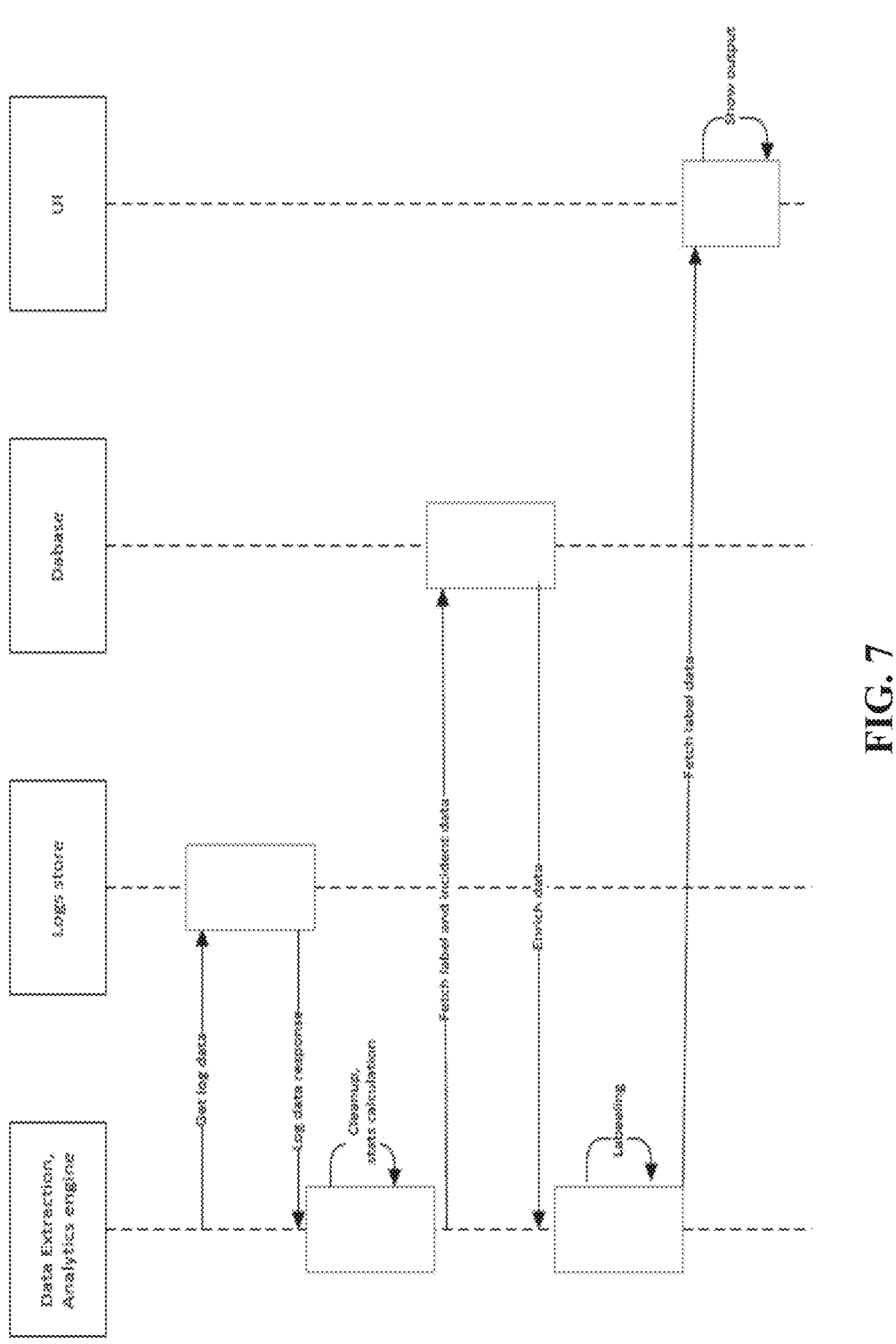
FIG. 7 is a workflow sequence diagram of an exemplary process for implementing a method for managing structured log data to facilitate predictive analytics of application activities to anticipate errors and identify abnormal application behaviors in a networked environment.

FIG. 7 is a workflow sequence diagram 700 of an exemplary process for implementing a method for managing structured log data to facilitate predictive analytics of application activities to anticipate errors and identify abnormal application behaviors in a networked environment. FIG. 7 may include components such as, for example, a data extraction and analytics engine titled "Data Extraction, Analytics Engine," a raw log data storage component titled "Logs store," a label storage component titled "Database," and a data visualization component titled "UI."

As illustrated in FIG. 7, the data extraction and analytics engine retrieves raw log data from the raw log data storage component. The data extraction and analytics engine may then perform statistical calculations to clean up the raw log data. Next, the data extraction and analytics engine may fetch label data and incident data from a label storage component. The fetched label data and the incident data may be utilized by the data extraction and analytics engine to enrich the cleaned-up log data. The enriched and cleaned-up log data may then be transmitted to a data visualization component for processing to be displayable on a graphical user interface.

Figure 8:
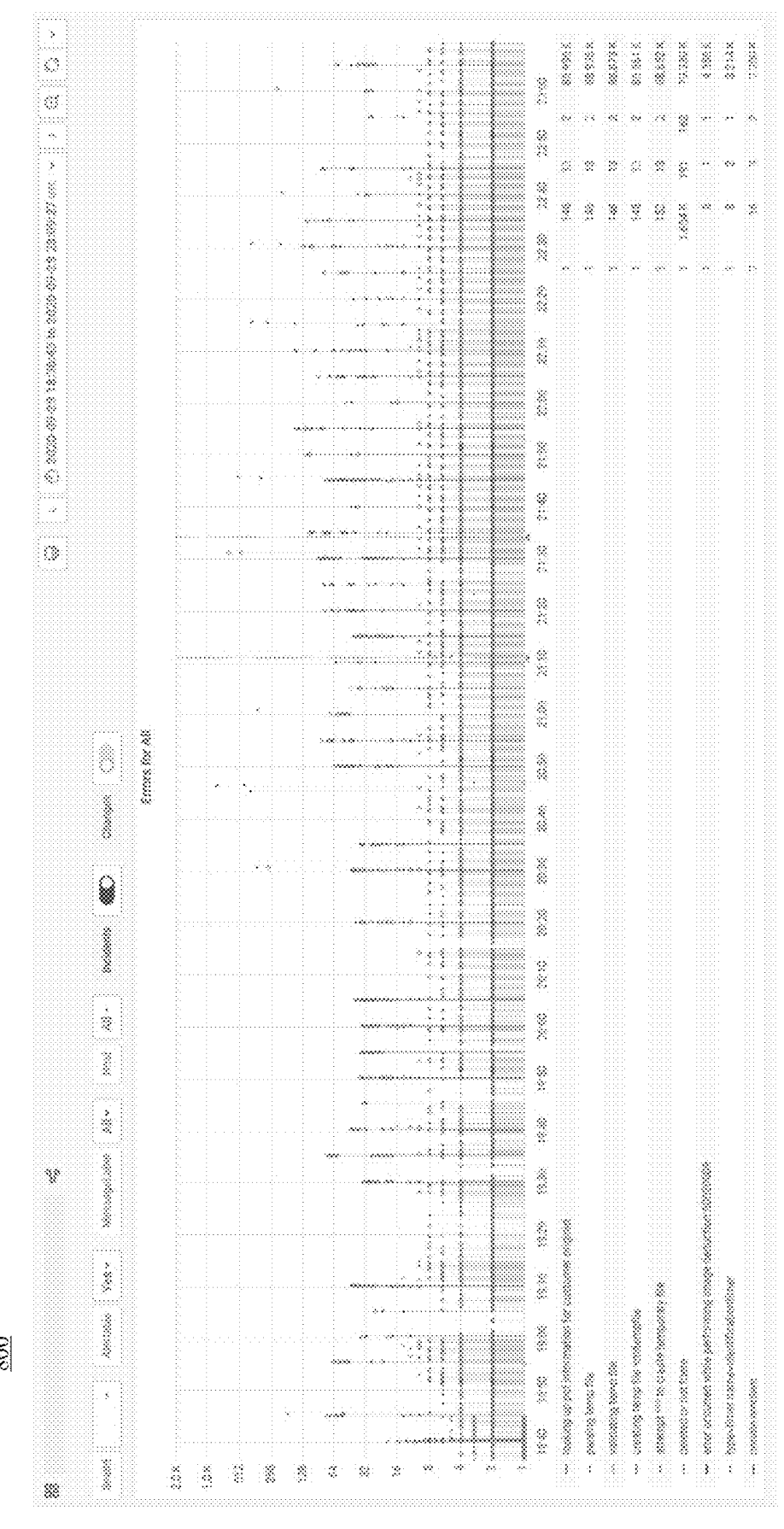
FIG. 8 is a screenshot that illustrates a graphical user interface for log data visualization that is usable for implementing a method for managing structured log data to facilitate predictive analytics of application activities to anticipate errors and identify abnormal application behaviors in a networked environment, according to an exemplary embodiment.

FIG. 8 is a screenshot 800 that illustrates a graphical user interface for log data visualization that is usable for implementing a method for managing structured log data to facilitate predictive analytics of application activities to anticipate errors and identify abnormal application behaviors in a networked environment, according to an exemplary embodiment.

As illustrated in FIG. 8, the structured log data is visualized for an exemplary application in a graphical user interface. The graphical user interface may include data visualization elements such as, for example, a graph as well as user selectable graphical elements to alter the data visualization elements. The user selectable graphical elements may include filter criteria such as, for example, application identifier criteria, alertable filter criteria, message label filter criteria, and host filter criteria. The alertable filter criteria may indicate when a message is part of an alert to be raised for a production operations team. The user selectable graphical elements may also include an annotation to show incident data as well as an annotation to show change record data corresponding to the application.

Figure 9:
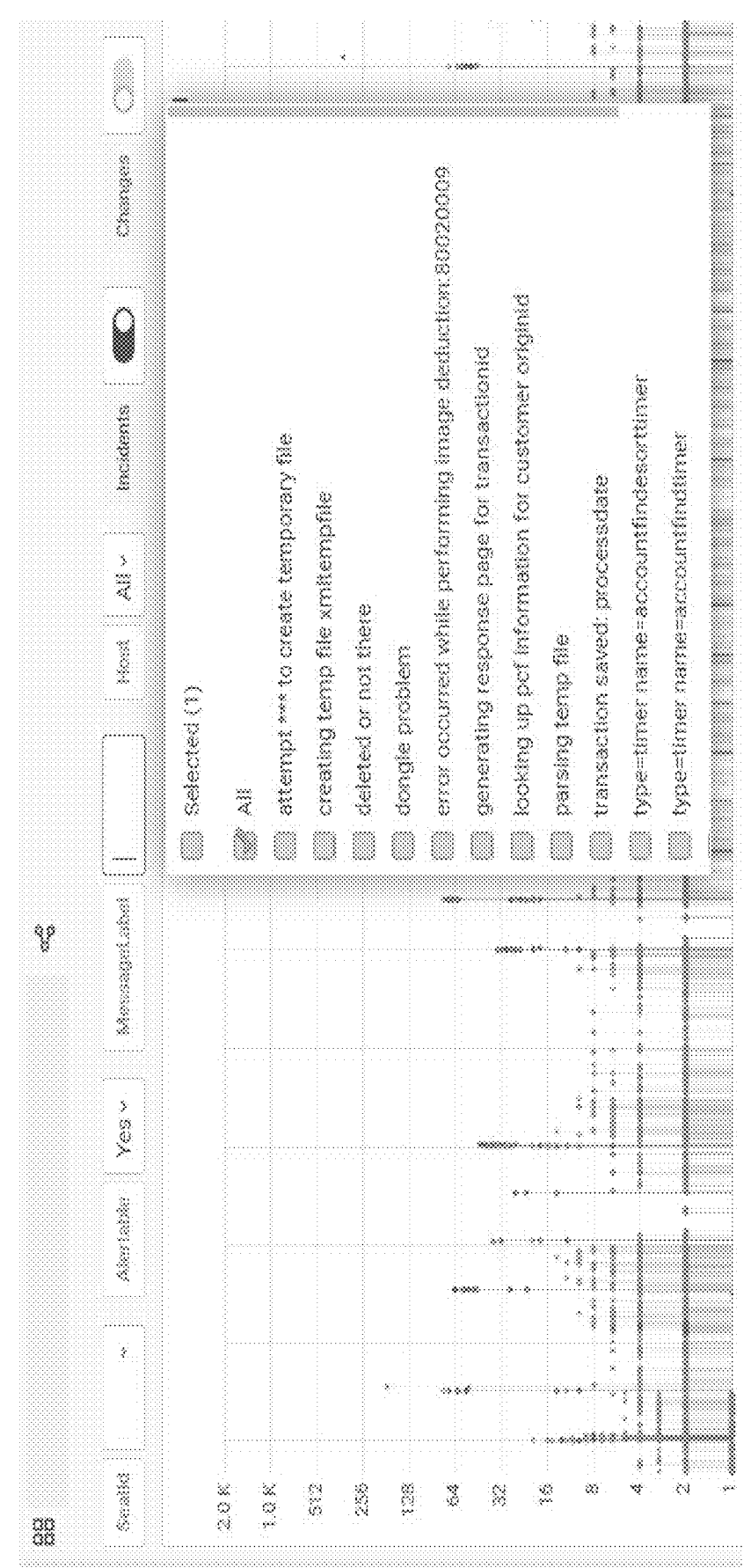
FIG. 9 is a screenshot that illustrates a graphical user interface for message label filter criteria selection that is usable for implementing a method for managing structured log data to facilitate predictive analytics of application activities to anticipate errors and identify abnormal application behaviors in a networked environment, according to an exemplary embodiment.

FIG. 9 is a screenshot 900 that illustrates a graphical user interface for message label filter criteria selection that is usable for implementing a method for managing structured log data to facilitate predictive analytics of application activities to anticipate errors and identify abnormal application behaviors in a networked environment, according to an exemplary embodiment. FIG. 9 is an expanded view of the message label filter criteria from FIG. 8.

As illustrated in FIG. 9, the graphical user interface may include a user selectable graphical element to expand the message label filter criteria. The selectable graphical elements may correspond to check boxes to identify to a user which message label filter criteria has been selected. The message label filter criteria may include a plurality of criteria titled "All," "Attempt *** to create temporary file," "creating tempt file xmltempfile," "deleted or not there," "dongle problem," "error occurred while performing image deduction," "generating response page for transactionid," "looking up pcf information for customer originid," "parsing temp file," transaction saved: processsdate," "type=timer name=accountfindesorttimer," and "type=timer name=accountfindtimer."

Figure 10:
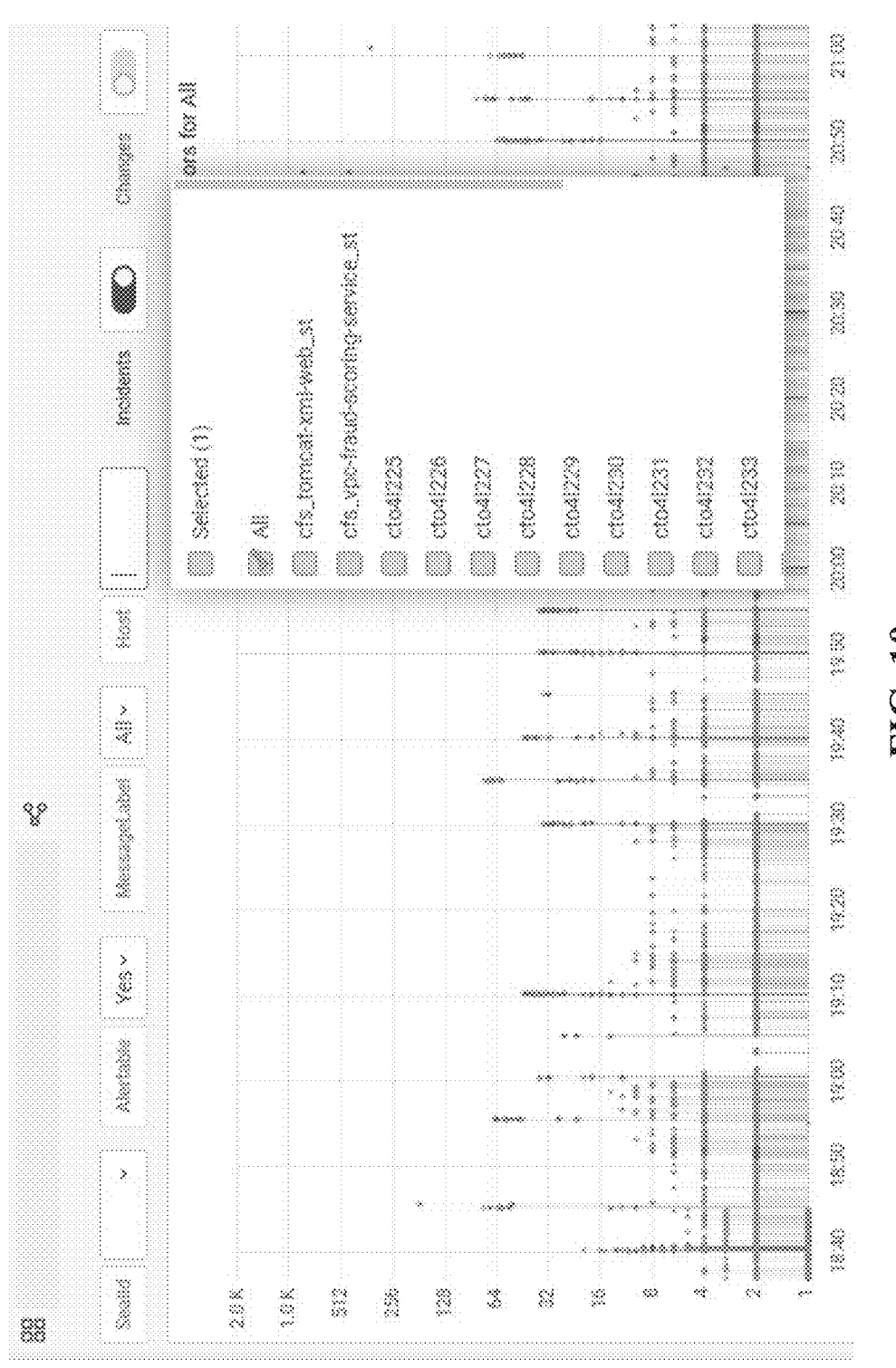
FIG. 10 is a screenshot that illustrates a graphical user interface for host filter criteria selection that is usable for implementing a method for managing structured log data to facilitate predictive analytics of application activities to anticipate errors and identify abnormal application behaviors in a networked environment, according to an exemplary embodiment.

FIG. 10 is a screenshot 1000 that illustrates a graphical user interface for host filter criteria selection that is usable for implementing a method for managing structured log data to facilitate predictive analytics of application activities to anticipate errors and identify abnormal application behaviors in a networked environment, according to an exemplary embodiment. FIG. 10 is an expanded view of the host filter criteria from FIG. 8. As illustrated in FIG. 10, the graphical user interface may include a user selectable graphical element to expand the host filter criteria. The selectable graphical elements may correspond to check boxes to identify to a user which host filter criteria has been selected.

Figure 11:
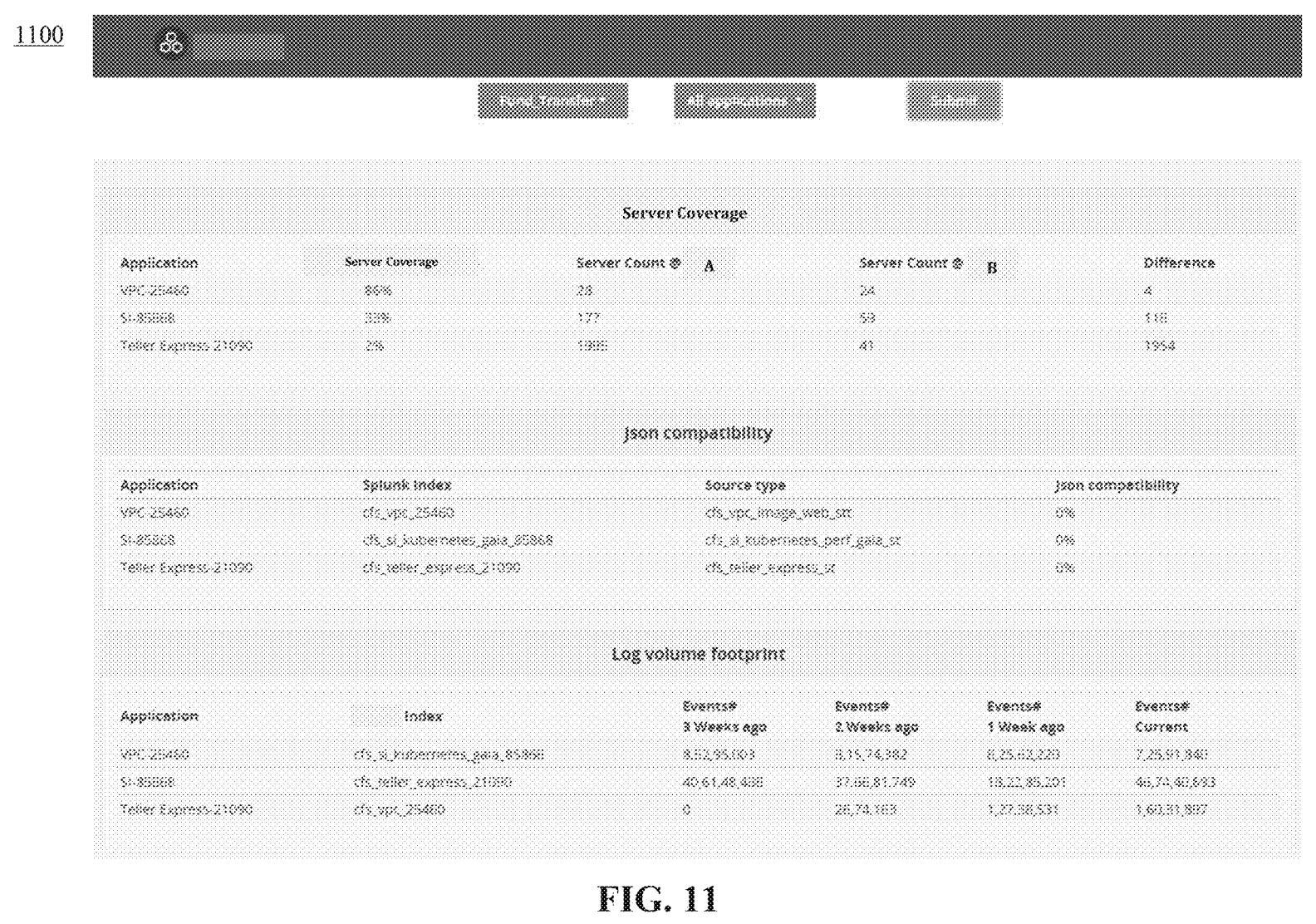

FIG. 11 is a screenshot 1100 that illustrates a browser graphical user interface for log data visualization that is usable for implementing a method for managing structured log data to facilitate predictive analytics of application activities to anticipate errors and identify abnormal application behaviors in a networked environment, according to an exemplary embodiment.

As illustrated in FIG. 11, the browser graphical user interface may include user selectable graphical elements to alter the information displayed. The user selectable graphical elements may include filter criteria such as, for example, fund transfer filter criteria and all applications filter criteria. The browser graphical user interface may also include a user selectable graphical element titled "submit" to finalize the selected filter criteria and initiate the displaying of data based on the selected filter criteria. Data may be organized for display in the browser graphical user interface using data tables that include rows and columns of data.

Accordingly, with this technology, an optimized process for managing structured log data to facilitate predictive analytics of application activities to anticipate errors and identify abnormal application behaviors in a networked environment is provided.

Although the invention has been described with reference to several exemplary embodiments, it is understood that the words that have been used are words of description and illustration, rather than words of limitation. Changes may be made within the purview of the appended claims, as presently stated and as amended, without departing from the scope and spirit of the present disclosure in its aspects. Although the invention has been described with reference to particular means, materials and embodiments, the invention is not intended to be limited to the particulars disclosed; rather the invention extends to all functionally equivalent structures, methods, and uses such as are within the scope of the appended claims.

For example, while the computer-readable medium may be described as a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the embodiments disclosed herein.

The computer-readable medium may comprise a non-transitory computer-readable medium or media and/or comprise a transitory computer-readable medium or media. In a particular non-limiting, exemplary embodiment, the computer-readable medium can include a solid-state memory such as a memory card or other package that houses one or more non-volatile read-only memories. Further, the computer-readable medium can be a random-access memory or other volatile re-writable memory. Additionally, the computer-readable medium can include a magneto-optical or optical medium, such as a disk or tapes or other storage device to capture carrier wave signals such as a signal communicated over a transmission medium. Accordingly, the disclosure is considered to include any computer-readable medium or other equivalents and successor media, in which data or instructions may be stored.

Although the present application describes specific embodiments which may be implemented as computer programs or code segments in computer-readable media, it is to be understood that dedicated hardware implementations, such as application specific integrated circuits, programmable logic arrays and other hardware devices, can be constructed to implement one or more of the embodiments described herein. Applications that may include the various embodiments set forth herein may broadly include a variety of electronic and computer systems. Accordingly, the present application may encompass software, firmware, and hardware implementations, or combinations thereof. Nothing in the present application should be interpreted as being implemented or implementable solely with software and not hardware.

Although the present specification describes components and functions that may be implemented in particular embodiments with reference to particular standards and protocols, the disclosure is not limited to such standards and protocols. Such standards are periodically superseded by faster or more efficient equivalents having essentially the same functions. Accordingly, replacement standards and protocols having the same or similar functions are considered equivalents thereof.

The illustrations of the embodiments described herein are intended to provide a general understanding of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method for providing predictive analytics based on structured log data, the method being implemented by at least one processor, the method comprising:

retrieving, by the at least one processor via a network interface, raw log data from at least one data storage component, the raw log data including information corresponding to a plurality of applications;

parsing, by the at least one processor, the raw log data to identify at least one key token within the raw log data, the at least one key token being a textual phrase that includes at least one from among application error information and abnormal application behavior information, and corresponding to at least one application;

identifying, by the at least one processor, at least one predetermined label that describes the at least one key token;

generating, by the at least one processor, the structured log data based on the at least one key token and the at least one predetermined label;

retrieving, by the at least one processor, incident data corresponding to the plurality of applications;

predicting, by the at least one processor using at least one model, at least one future operational anomaly based on the structured log data and the incident data; and resolving the future operational anomaly before the predicted future operational anomaly occurs;

wherein the structured log data is smaller in size than the corresponding raw log data, such that the structured log data requires less storage memory than the corresponding raw log data.

2. The method of claim 1, further comprising:

determining, by the at least one processor for the at least one key token, a number of occurrences in the raw log data, the number of occurrences relating to a tally of times the at least one key token appears in the raw log data;

identifying, by the at least one processor in the raw log data, a timestamp for each of the number of occurrences;

identifying, by the at least one processor in the raw log data, at least one host name for each of the number of occurrences; and updating, by the at least one processor, the structured log data to include at least one from among the number of occurrences, the timestamp, and the at least one host name.

3. The method of claim 1, wherein the at least one key token is discovered in the raw log data by using the at least one model.

4. The method of claim 1, wherein the structured log data includes a record data format that corresponds to at least one from among a spreadsheet data format and a tabular data format.

5. The method of claim 1, further comprising:

associating, by the at least one processor, a time parameter with the structured log data based on the at least one predetermined label, the time parameter including an amount of time to persist the structured log data; and persisting, by the at least one processor, the structured log data and the association in the at least one data storage component for the amount of time.

6. The method of claim 1, wherein the incident data includes an impact analysis of an event for each of the plurality of applications, the impact analysis relating to a system impact determination that includes incident records and change records.

7. The method of claim 1, wherein the future operational anomaly including at least one from among an application error condition, an application outage condition, an abnormal application behavior condition, a dependent system error condition, a dependent system outage condition, and an abnormal dependent system behavior condition.

8. The method of claim 1, wherein the at least one model includes at least one from among a machine learning model, a mathematical model, a process model, and a data model.

9. A computing device configured to implement an execution of a method for providing predictive analytics based on structured log data, the computing device comprising:
   a processor;
   a memory; and
   a communication interface coupled to each of the processor and the memory,
   wherein the processor is configured to:
   retrieve, via a network interface, raw log data from at least one data storage component, the raw log data including information corresponding to a plurality of applications;
   parse the raw log data to identify at least one key token within the raw log data, the at least one key token being a textual phrase that includes at least one from among application error information and abnormal application behavior information, and corresponding to at least one application;
   identify at least one predetermined label that describes the at least one key token;
   generate the structured log data based on the at least one key token and the at least one predetermined label;
   retrieve incident data corresponding to the plurality of applications;
   predict, by using at least one model, at least future operational anomaly based on the structured log data and the incident data; and
   resolve the predicted at least one future operational anomaly before the predicted at least one future operational anomaly occurs;
   wherein the structured log data is smaller in size than the corresponding raw log data, such that the structured log data requires less storage memory than the corresponding raw log data.

10. The computing device of claim 9, wherein the processor is further configured to:
   determine, for the at least one key token, a number of occurrences in the raw log data, the number of occurrences relating to a tally of times the at least one key token appears in the raw log data;
   identify, in the raw log data, a timestamp for each of the number of occurrences;
   identify, in the raw log data, at least one host name for each of the number of occurrences; and
   update the structured log data to include at least one from among the number of occurrences, the timestamp, and the at least one host name.

11. The computing device of claim 9, wherein the at least one key token corresponds to at least one textual phrase that includes at least one from among application error information and abnormal application behavior information.

12. The computing device of claim 9, wherein the processor is further configured to discover the at least one key token in the raw log data by using the at least one model.

13. The computing device of claim 9, wherein the structured log data includes a record data format that corresponds to at least one from among a spreadsheet data format and a tabular data format.

14. The computing device of claim 9, wherein the processor is further configured to:
   associate a time parameter with the structured log data based on the at least one predetermined label, the time parameter including an amount of time to persist the structured log data; and
   persist the structured log data and the association in the at least one data storage component for the amount of time.

15. The computing device of claim 9, wherein the incident data includes an impact analysis of an event for each of the plurality of applications, the impact analysis relating to a system impact determination that includes incident records and change records.

16. The computing device of claim 9, wherein the future operational anomaly including at least one from among an application error condition, an application outage condition, an abnormal application behavior condition, a dependent system error condition, a dependent system outage condition, and an abnormal dependent system behavior condition.

17. The computing device of claim 9, wherein the at least one model includes at least one from among a machine learning model, a mathematical model, a process model, and a data model.

18. A non-transitory computer readable storage medium storing instructions for providing predictive analytics based on structured log data, the storage medium comprising executable code which, when executed by a processor, causes the processor to:
   retrieve, via a network interface, raw log data from at least one data storage component, the raw log data including information corresponding to a plurality of applications;
   parse the raw log data to identify at least one key token within the raw log data, the at least one key token being a textual phrase that includes at least one from among application error information and abnormal application behavior information, and corresponding to at least one application;
   identify at least one predetermined label that describes the at least one key token;
   generate the structured log data based on the at least one key token and the at least one predetermined label;
   retrieve incident data corresponding to the plurality of applications;
   predict, by using at least one model, at least future operational anomaly based on the structured log data and the incident data;
   resolve the predicted at least one future operational anomaly before the predicted at least one future operational anomaly occurs;
   wherein the structured log data is smaller in size than the corresponding raw log data, such that the structured log data requires less storage memory than the corresponding raw log data.

19. The storage medium of claim 18, wherein the future operational anomaly including at least one from among an application error condition, an application outage condition, an abnormal application behavior condition, a dependent system error condition, a dependent system outage condition, and an abnormal dependent system behavior condition.

\* \* \* \* \*